United States Patent [19]
Cote

[11] Patent Number: 5,906,911
[45] Date of Patent: May 25, 1999

[54] PROCESS OF FORMING A DUAL DAMASCENE STRUCTURE IN A SINGLE PHOTORESIST FILM

[75] Inventor: William J. Cote, Poughquag, N.Y.

[73] Assignee: International Business Machines Corporation, Armonk, N.Y.

[21] Appl. No.: 08/828,458

[22] Filed: Mar. 28, 1997

[51] Int. Cl.$^6$ .................................................. G03F 7/00
[52] U.S. Cl. .................. 430/316; 430/312; 430/394; 430/314
[58] Field of Search .................................. 430/311, 312, 430/313, 314, 315, 394

[56] References Cited

U.S. PATENT DOCUMENTS

| | | | |
|---|---|---|---|
| 5,275,896 | 1/1994 | Garofalo | 430/313 |
| 5,292,623 | 3/1994 | Kemp | 430/313 |
| 5,491,047 | 2/1996 | Kim et al. | 430/329 |
| 5,525,192 | 6/1996 | Lee et al. | 430/313 |
| 5,529,953 | 6/1996 | Shoda | 437/189 |
| 5,550,007 | 8/1996 | Taylor et al. | 430/314 |
| 5,686,223 | 11/1997 | Cleeves | 430/312 |

OTHER PUBLICATIONS

C.A. Spence, S.A. MacDonald and H. Schlosser, "Silyation of Poly (t–BOC) Styrene Resists: Performance and Mechanisms", SPIE vol. 1262 Advances in Resist Technology and Processing VII (1990), pp. 344–357.

*Primary Examiner*—Kathleen Duda
*Attorney, Agent, or Firm*—Ratner & Prestia; Joseph P. Abate

[57] ABSTRACT

The present invention is embodied in a process for creating a dual damascene structure. The process includes the steps of forming a photoresist film on a substrate, pattern exposing the photoresist film to form a first pattern in the photoresist film, and forming an etch resistant layer in the first pattern. The resistant layer is resistant to a further pattern exposure and etching. The photoresist film is pattern exposed a second time to form a second pattern in the photoresist film. The sections of the photoresist film corresponding to the second pattern are removed and the substrate is etched to form the second pattern in the substrate. The resistant layer is removed and the substrate is etched to form the first pattern in the substrate. Finally, the remaining photoresist film is removed from the substrate.

16 Claims, 8 Drawing Sheets

PROCESS OF FORMING A DUAL DAMASCENE STRUCTURE IN A SINGLE PHOTORESIST FILM

FIELD OF THE INVENTION

The present invention relates to photo lithography and, more particularly, to a process for creating a dual damascene structure in a single photoresist film.

BACKGROUND OF THE INVENTION

Integrated circuits are manufactured using lithographic processes. A lithographic process introduces energy onto selected portions of an energy sensitive photoresist material overlying a substrate. Energy is introduced onto selected portions of the photoresist through openings in a mask substrate interposed between the energy source and the photoresist material. These openings in the mask substrate define the pattern. The pattern is transferred into the photoresist material by the energy that is permitted to pass through the openings in the mask substrate and into the photoresist. Thus, it is an image of the pattern defined by the mask substrate that is transferred into the photoresist material.

After the image is transferred into the photoresist material, the photoresist material is developed to form a pattern. The pattern is then transferred by etching into the substrate underlying the photoresist material. Once the pattern is incorporated into the substrate, it becomes a feature of the integrated circuit. The energy used to expose the photoresist material, the composition of the photoresist material, the thickness of the photoresist material, and many other factors affect the ability of a lithographic process to delineate a feature in a substrate. The smaller the design rule, the more precisely the feature must be delineated. For example, design rules for 0.5 $\mu$m are being replaced by design rules of less than 0.5 $\mu$m.

Another factor which affects the ability of a process to define features in a substrate is the topography of the substrate surface. Substrate surface topography is either planar or non-planar. Non-planar surfaces are referred to as such because their surfaces are not in a single plane. When a photoresist material is applied over a non-planar substrate, the photoresist layer only approximately conforms to the non-planar substrate surface. As a result, the distance between the photoresist surface and the substrate surface tends to be nonuniform. This nonuniformity can adversely affect the pattern developed in a photoresist material because the depth at which the image is focused in the photoresist will also vary. If the depth of focus varies over the photoresist surface, the features resolved in the photoresist may not satisfy the applicable design rules.

The effects of planar and non-planar surfaces on the lithography process are apparent in the formation of dual damascene structures. Dual damascene structures include line trenches and via trenches. Via trenches are formed in the bottom of the line trenches. FIG. 14 is a cross-sectional schematic view of a prior art dual damascene structure formed on a substrate 500 in an oxide film 530. The dual damascene structure includes via trenches 520 formed in line trench 510.

Current fabrication techniques used to produce a dual damascene structure include forming a first photoresist film on an oxide film to be etched. The first photoresist film is patterned using a line-pattern mask and etched to form the line-pattern in the oxide film. The remains of the first photoresist film are removed and a second photoresist film is formed on the etched oxide film. The second photoresist is patterned using a via-pattern mask and etched to form the via-pattern in the oxide film. Alternatively, the via-pattern and then the line-pattern may be formed in the oxide film. By using this process, the vias and the lines are formed in the oxide film 530 using two, separate photoresist films.

Results achieved using lithography are typically better when the photoresist is applied to a planar surface such as the surface of the oxide film 530 before any etching. When the surface is planar, the photoresist film may be formed with a uniform thickness. As a result, the focal plane has a uniform thickness. In this case, the line-pattern or the via-pattern may be formed in the photoresist film with high fidelity.

In the prior art example above, it is relatively easy to transfer the line-pattern to the photoresist film with high resolution and high fidelity across the surface using state-of-the-art lithographic equipment and materials because the initial surface of the oxide film is planar. Then the line-pattern in the photoresist may be transferred to the substrate with high resolution and high fidelity using reactive ion etching. The surface of the substrate is now non-planar because of this first step. Next, the vias are formed. The photoresist film used to form vias is applied on the non-planar surface. As is shown in FIG. 15, a typical line-pattern consists of large variations in both line widths and space widths. FIG. 15 is a cross-sectional schematic view of a photoresist film 550 for forming the via-pattern on an oxide film 552 after the line-pattern has been etched into the oxide film 552. The line-pattern density varies across the oxide film 552 from low (narrow lines and wide spaces) in the line-pattern-density region 554 to high (wide lines and narrow spaces) in the line-pattern-density region 556.

The via photo resist film 550 is thick in the low line-pattern-density region 554 and thin in the high line-pattern-density region 556. As a result, the focal plane varies because the thickness of the photoresist film 550 varies from region 554 to region 556. Reference lines 558, 560, and 562 illustrate the variations in the thickness of the photoresist film 550. It is more difficult to produce a good via-pattern in the photoresist film 550 using the same state-of-the-art lithographic equipment and materials used to form the line-pattern because the starting surface is non-planar.

A comparison of reference lines 558 and 560 illustrates a second problem caused by forming the via photoresist film 550 on the non-planar oxide film 552. The photoresist film 550 is thicker in a trench than it is in the field surrounding the trench. Usually, the thickness of the photoresist film is selected so that some photoresist material will remain in the field, the area surrounding the via structure 564, after the etch is complete. Typically, the thickness of the photoresist film is also minimized because it is easier to form minimum-sized structures in a thinner photoresist film. In the example shown in FIG. 15, the via structure 564 is in a trench where the photoresist is thick. As a result, an increased exposure dose is necessary to expose the thick photoresist which makes it more difficult to produce minimum-sized vias. The line and via-patterns are therefore more difficult to produce which causes yield loss, the use of more expensive equipment, and more rework. Reversing the process to apply vias first and lines second provides little or no relief from these problems.

SUMMARY OF THE INVENTION

The present invention is embodied in a process for creating a dual damascene structure. The process includes the steps of forming a photoresist film on a substrate, pattern exposing the photoresist film to form a first pattern in the photoresist film, and forming an etch resistant layer in the first pattern. The resistant layer is resistant to a further pattern exposure and etching. The photoresist film is pattern exposed a second time to form a second pattern in the photoresist film. The sections of the photoresist film corresponding to the second pattern are removed and the substrate is etched to form the second pattern in the substrate. The resist except the resistant layer itself and the resist below the resistant layer is removed and the substrate is etched to form the first pattern in the substrate. Finally, the remaining photoresist film is removed from the substrate.

The present invention also includes the steps of forming a photoresist film on a substrate and pattern exposing the photoresist film to form a second pattern in the photoresist film. The sections of the photoresist film corresponding to the second pattern are removed. Next, the photoresist film is pattern exposed to form a first pattern in the photoresist film and an etch-resistant layer in the first pattern. The substrate is etched to form the second pattern in the substrate. The resistant layer is removed and the substrate is etched to form the first pattern in the substrate. Finally, the remaining photoresist film is removed from the substrate.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawings. It is emphasized that, according to common practice, the various features of the drawing are not to scale. On the contrary, the dimensions of the various features are arbitrarily expanded or reduced for clarity. Included in the drawings are the following figures.

DETAILED DESCRIPTION

Overview

The present invention is embodied in a process that forms two, separate patterns in a single photoresist film to form a dual photoresist pattern. Wet development is used to form one pattern and dry development is used to form another pattern. The dry development process includes the selective silylation of an acidic resist. The dual photoresist pattern is translated into, for example, an insulator to form a dual damascene structure.

By using this process, the application of a second photoresist layer is avoided. Further, an additional etching step is avoided and a wider process window is provided. Finally, aspect ratio problems are avoided. In addition, the photoresist film may be formed with a uniform thickness of minimum thickness. This provides a maximum depth of focus. Depth of focus is a range of focus positions for a given resolution image in which the image meets the patterning specifications, e.g., wall profile, line width, aspect ratio, and the like. As a result, problems associated with variations in depth focus may be avoided.

The process includes the steps of applying a photoresist film on a substrate. The photoresist film is pattern exposed using a first mask or reticle and selective silylation is performed. The photoresist film is then patterned exposed using a second mask or reticle and photoresist exposed by the second mask or reticle is removed. The second pattern is translated into the substrate by etching. The non-silylated photoresist is then removed and the substrate is etched to form the first pattern in the substrate. Finally, the remaining photoresist is removed. Alternatively, the second pattern may be formed in the photoresist film before forming the first pattern in the photoresist film.

DETAILED DESCRIPTION OF THE PREFERRED EMBODIMENTS

Figure 1:
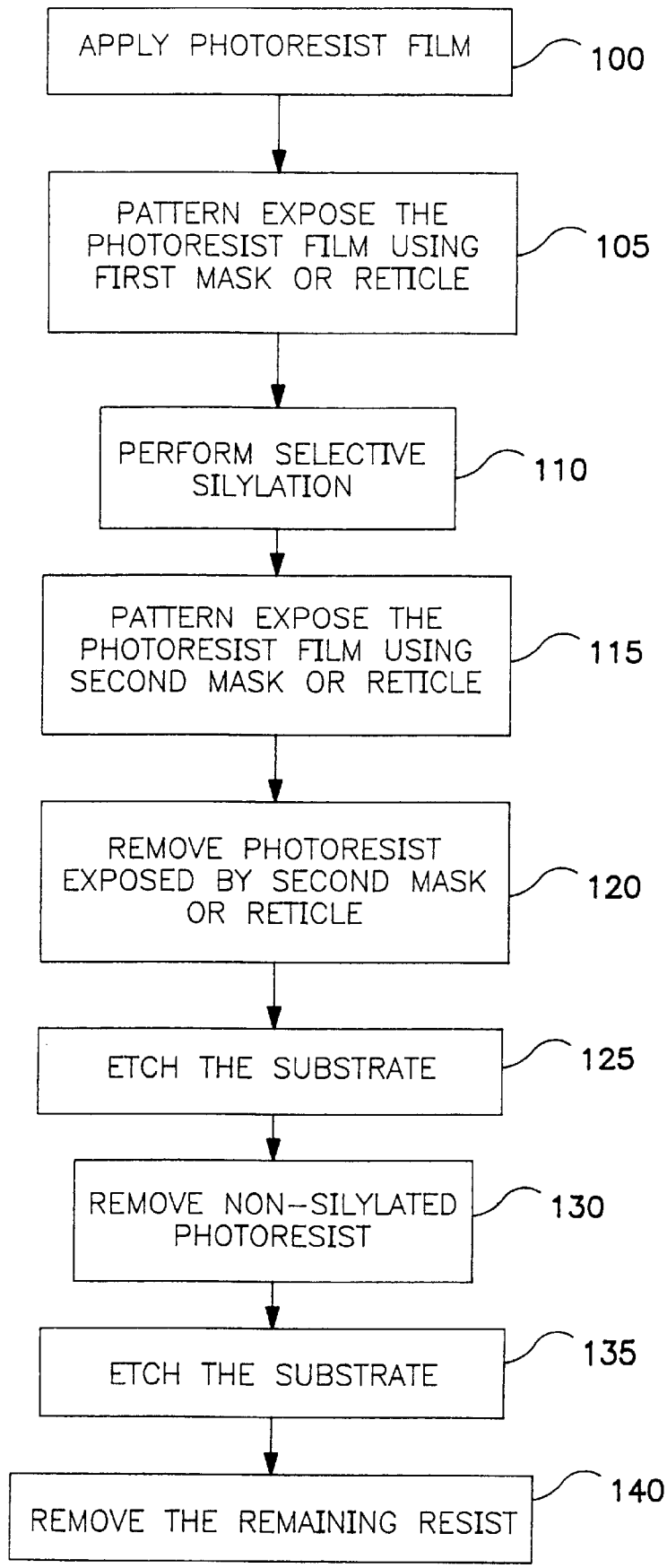
FIG. 1 is a flow chart diagram illustrating a process of forming a dual damascene structure according to an exemplary embodiment of the present invention.

Referring now to the drawings, wherein like reference numerals refer to like elements throughout, FIG. 1 shows a process for producing a dual damascene structure. The process shown in FIG. 1 is described below with reference to FIGS. 2 through 10 in which a semiconductor device is shown during successive stages of manufacture.

Figure 2:
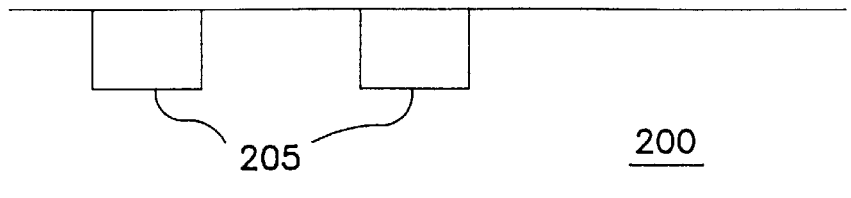
FIG. 2 through 10 are cross-sectional schematic diagrams of a semiconductor device illustrating the process of forming a dual damascene structure according to the process shown in FIG. 1.
Figure 3:
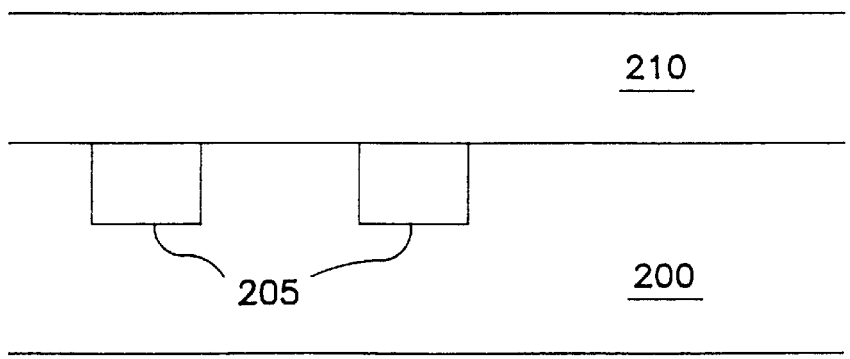
Figure 4:
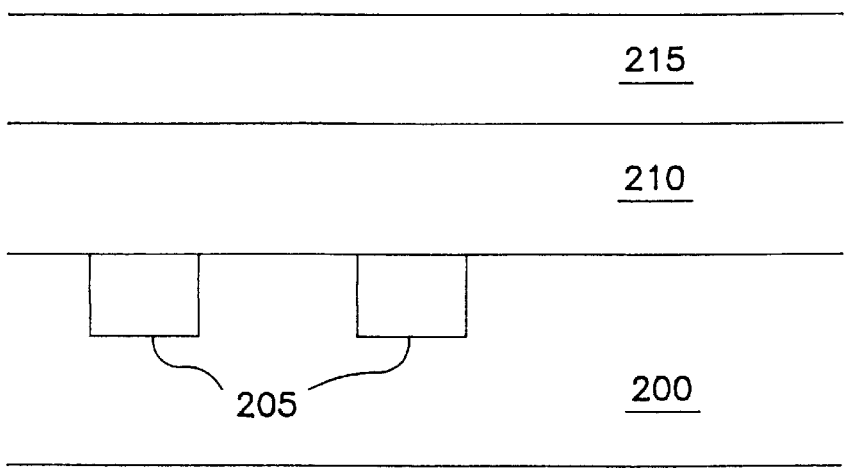

As is shown in FIG. 2, the starting material is, for example, a planarized metal pattern 205 formed, for example, in a silicon substrate 200. As is shown in FIG. 3, an insulating oxide film 210 such silicon dioxide is deposited on the substrate 200. The dual damascene structure is formed in the oxide film 210. As is shown in FIG. 4, at step 100 (shown in FIG. 1), a photoresist film 215 is formed on the oxide film 210. The photoresist film 215 is deposited on the substrate using any acceptable technique including, for example, spin-deposition.

The photoresist film 215 is made of a photoresist material. Radiation induces chemical changes in the photoresist material in the imaging layer. These chemical changes introduce a selectivity into the photoresist material. A silylating reagent that will selectively react with the photoresist material in one of either the exposed or unexposed regions, but not both, is introduced into the imaging layer. The silylating reagent preferentially reacts with the photoresist material in only one region. Due to this preferential reaction, the silylating reagent selectively diffuses into one of the exposed or unexposed regions of the photoresist material. This reaction and resulting diffusion cause the photoresist material in the affected region to swell. The coated substrate is then subjected to reactive ion etching, preferably $O_2$ reactive ion etching, which causes silicon oxides to form in the surface of the silylated photoresist material, thereby forming an etch mask in situ over the silylated portions of the photoresist material.

The mask so formed allows etching selective to the surface of the imaging layer. In this manner, fine features can be developed in the substrate. Because this process does not require the imaging layer to be exposed throughout its entire thickness, it is characterized as a surface-imaging process.

The photoresist material is an acidic photoresist that allows selective silylation. Silylation is a process which permits a dry etching of the photoresist material by processing the photoresist to have resistance against $O_2$ reactive ion etching. One example of the photoresist material is a copolymer of styrene and p-tert-butoxycarbonyloxystyrene, mixed with a photoactive compound that generates hydrogen ions during photolysis. C. A. Spence, et al., Silylation of poly(t-BOC) styrene resists: Performance and Mechanisms, SPIE Vol. 1262, Advances in Resist Technology and Processing VII (1990), pp. 344–357, describes the use of this photoresist material in greater detail and is incorporated herein by reference. U.S. Pat. No. 5,550,007, titled SURFACE-IMAGING TECHNIQUE FOR LITHOGRAPHIC PROCESSES FOR DEVICE FABRICATION, dated Aug. 27, 1996, and issued to Taylor et al., describes other photoresist materials that allow selective silylation and which are suitable for use as the photoresist material. This patent is incorporated herein by reference for its teaching on photoresist materials and their use.

Figure 5:
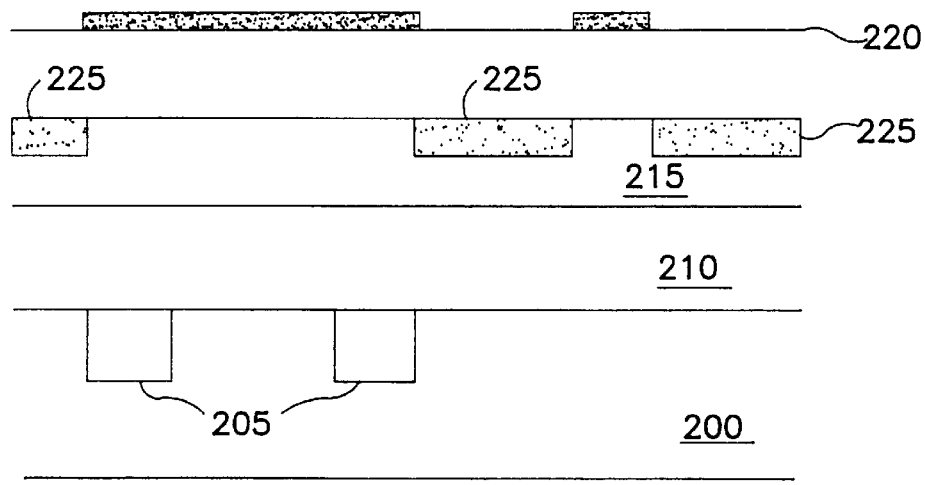

As is shown in FIG. 5, at step 105 (shown in FIG. 1), a line-pattern is transferred to the photoresist film 215 using, for example, a line-pattern mask 220 to form exposed regions 225 in the photoresist film 215. The line-pattern mask 220 is used to expose field areas and not the lines. The field areas are the areas surrounding the lines. The photoresist material is a material which, when exposed to energy, undergoes a chemical change, creating differences between the exposed and unexposed material which can be exploited in a lithographic process.

Examples of suitable photoresist polymers include poly (vinylalcohol) and its vinylacetate copolymers, poly (vinylphenol), poly(vinylmethlphenol)s, the cresol novolacs, poly(vinylresorcinol), poly(vinylcatechol), poly (vinylpyrogallol), resorcinol novolac, catechol novolac, the poly(vinylphenol)s, and the phenol novolacs.

At step 110 (shown in FIG. 1), the exposed photoresist film 215 is baked and exposed to silylating agents such as hexamethyl-disilazane (HMDS), hexa-methyl-cyclo-tri-silazane (HMCTS), or a similar compound. U.S. Pat. No. 5,550,007, titled SURFACE-IMAGING TECHNIQUE FOR LITHOGRAPHIC PROCESSES FOR DEVICE FABRICATION, dated Aug. 27, 1996, and issued to Taylor et al. describes other silylating agents and is incorporated herein by reference for its teachings on silylating agents.

The exposed regions 225 are silylated using, for example, HMDS. It is not necessary to completely silylate the entire thickness of the photoresist film 215. The exposed silylated field areas are impervious to a standard dry oxygen photoresist strip and no longer photo sensitive. The photoresist shapes that were masked during the field exposure are still photo active.

Figure 6:
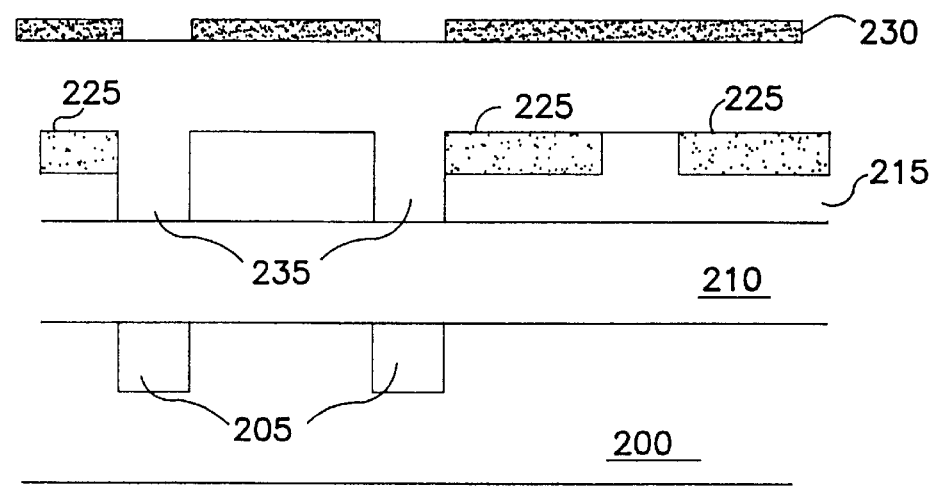

As is shown in FIG. 6, at step 115 (shown in FIG. 1), the resist film 215 is pattern-exposed a second time using a via-pattern mask 230. The via-pattern mask exposes areas that were not exposed and silylated with the line-pattern mask. Mis-aligned portions of the via-pattern are not transferred into the silylated regions 225 areas because these areas are no longer photo active.

At step 120 (shown in FIG. 1), the substrate is treated with an alkaline aqueous solution and the exposed regions 235 that were exposed using the via-pattern 230 mask are developed. At this stage in the process, there is a dual-pattern including lines and vias formed in the resist film 215. The line-pattern is defined by the silylated regions 225 and the via-pattern is defined by regions 235 where the photoresist was removed during development.

Figure 7:
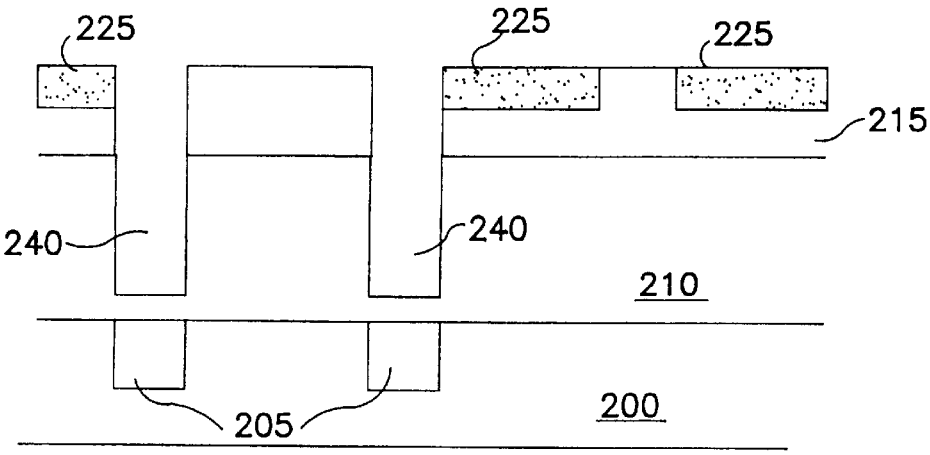

FIGS. 7 through 10 demonstrate how the dual-pattern in the resist film 215 is translated into the dual damascene structure in the oxide film 210 by etching. As is shown in FIG. 7, at step 125 (shown in FIG. 1), the substrate is subjected to a reactive ion etch process that anisotropically etches the oxide insulator much faster than the photoresist to form partially completed vias 240. At least a portion of the silylated regions 225 remain after this step. If silylated regions 225 were removed, the line-pattern would be erased.

Figure 8:
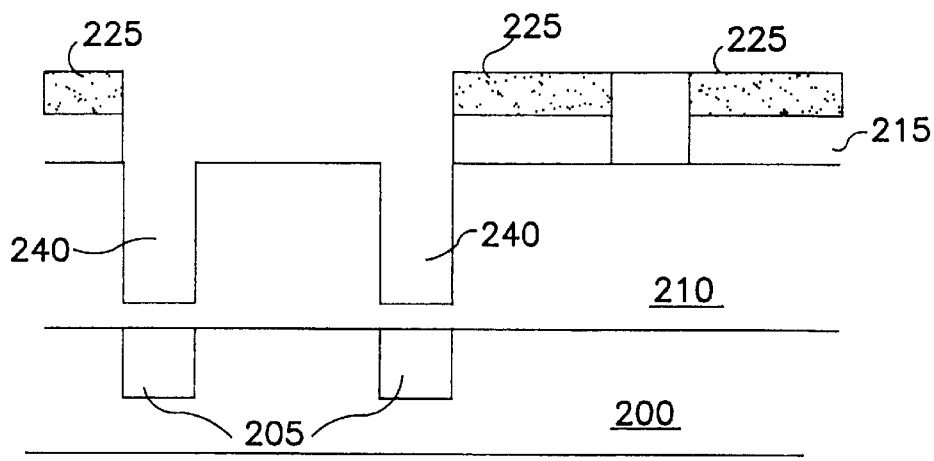
Figure 9:
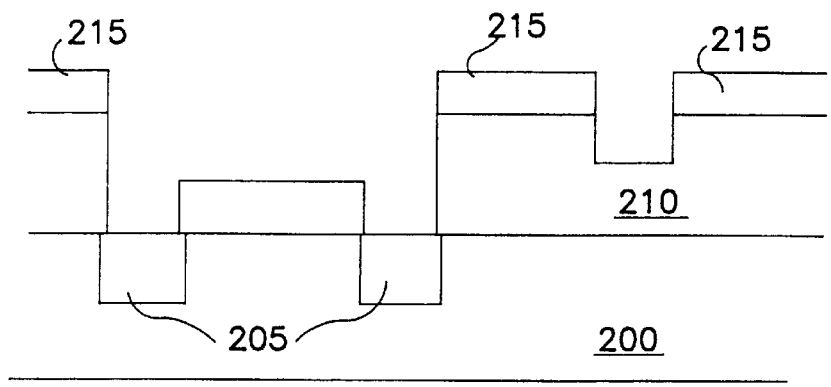
Figure 10:
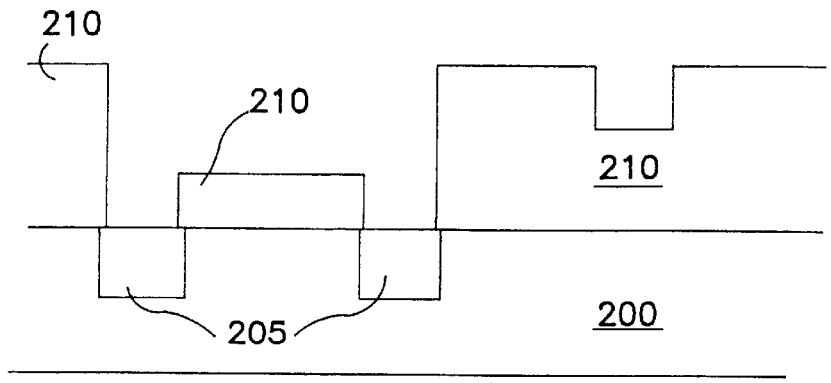

As is shown in FIG. 8, at step 130 (shown in FIG. 1), dry development of the line-pattern is performed by anisotropically etching the remaining photoresist that was not silylated using a directional $O_2$ RIE process. Significant amounts of material are not removed from the oxide-layer 210 during the $O_2$ RIE process. As is shown in FIG. 9, at step 135 (shown in FIG. 1), the line-pattern in the resist layer 215 is translated into the oxide layer using an oxide RIE process which also completes the formation of the via-pattern. In addition, the silylated photoresist is completely eroded during this last etch to expose non-silylated photoresist. At step 140 (shown in FIG. 1), the remaining photoresist is removed using a photoresist strip process. FIG. 10 illustrates the completed dual damascene structure.

For example, assume the oxide film 210 has a thickness of 1.0 $\mu$m and the dual damascene structure includes 0.50 $\mu$m lines and 0.50 $\mu$m vias. In this case, at step 125, the vias would be etched to a depth of 0.750 $\mu$m in the oxide film 210. At step 135, the line etch would be 0.50 $\mu$m for a total etch of 1.25 $\mu$m for an oxide film 210 having a thickness of 1.00 $\mu$m or 25% over-etch, which is typical.

Once the dual damascene structure is formed, a metal layer can be formed in the lines and vias formed in the oxide film 210. The metal layer provides electrical conductivity to components formed in the substrate to produce a semiconductor device or to complete intermediate steps in the fabrication of a semiconductor device. The components formed in the substrate can be any one of a number of different components that can be formed in a semiconductor substrate.

Figure 11:
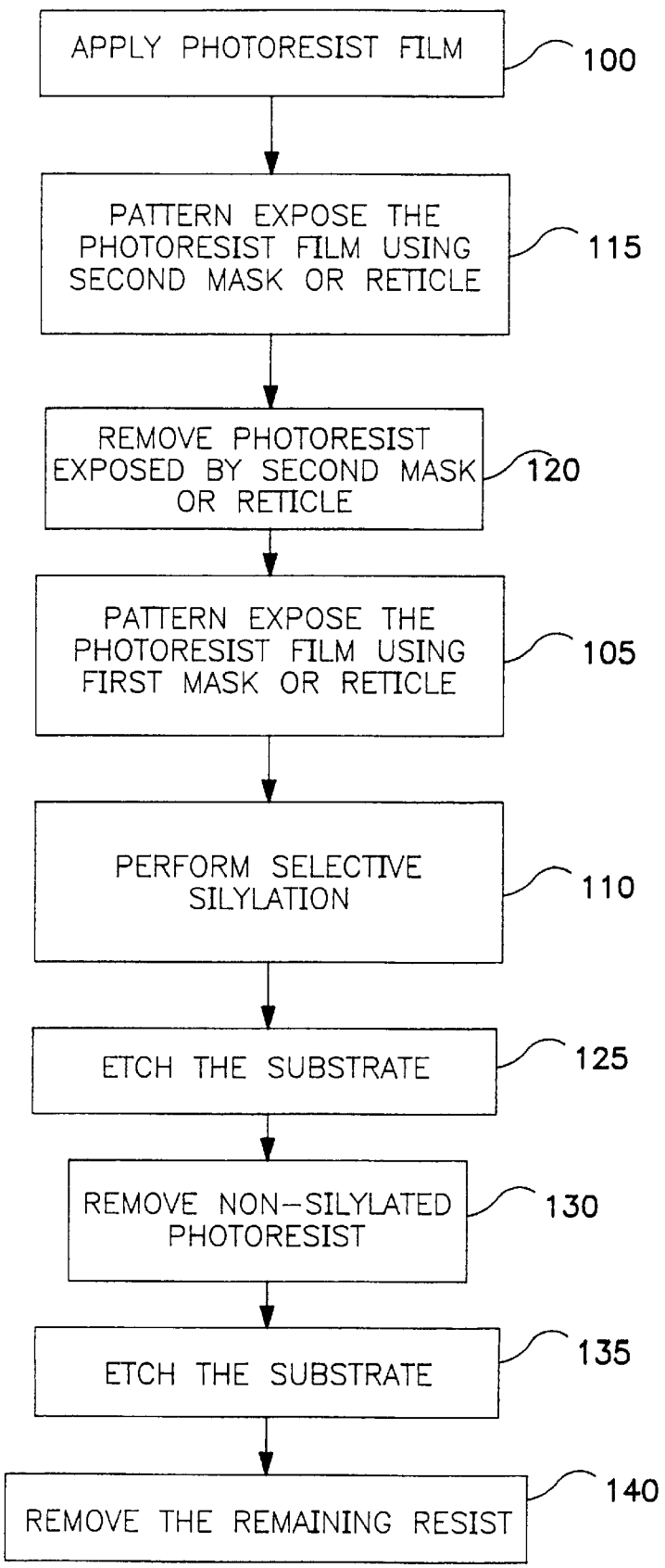
FIG. 11 is a flow chart diagram illustrating an alternative process of forming a dual damascene structure according to another exemplary embodiment of the present invention.

FIG. 11 illustrates an alternative embodiment where the via-pattern is formed first and then the line-pattern is formed in the photoresist film 215. The process shown in FIG. 11 is the same as the process shown in FIG. 1 except that the order of steps 110 through 120 is different. Accordingly, a detailed description of each of the steps is omitted for brevity.

Figure 12:
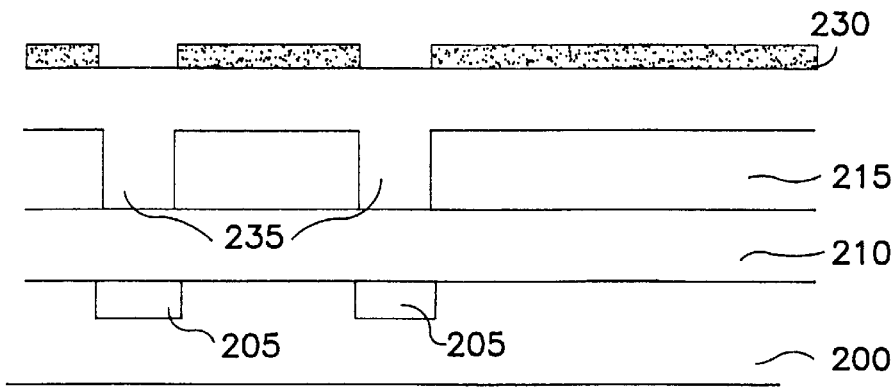
FIGS. 12 and 13 are cross-sectional schematic diagrams illustrating the process of forming a dual damascene structure according to the process shown in FIG. 11.
Figure 13:
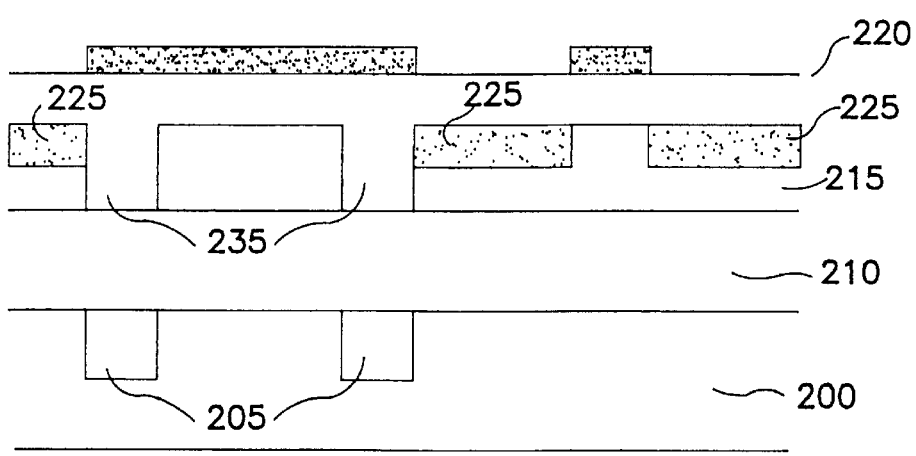
Figure 14:
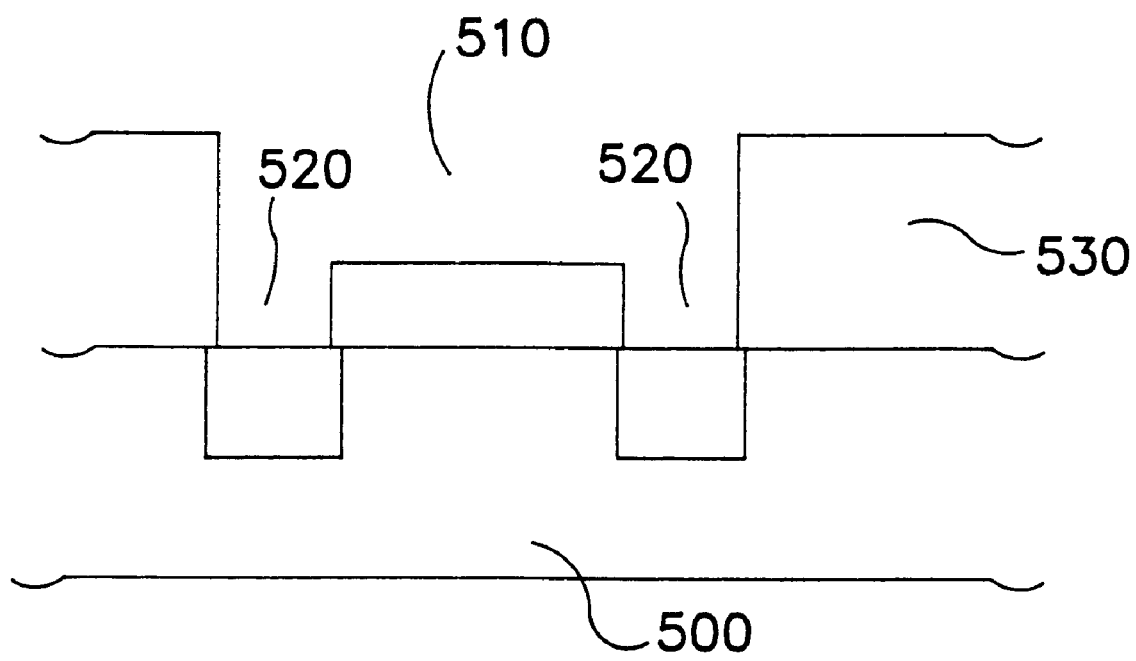
FIG. 14 is a cross-sectional schematic view of a dual damascene structure.
Figure 15:
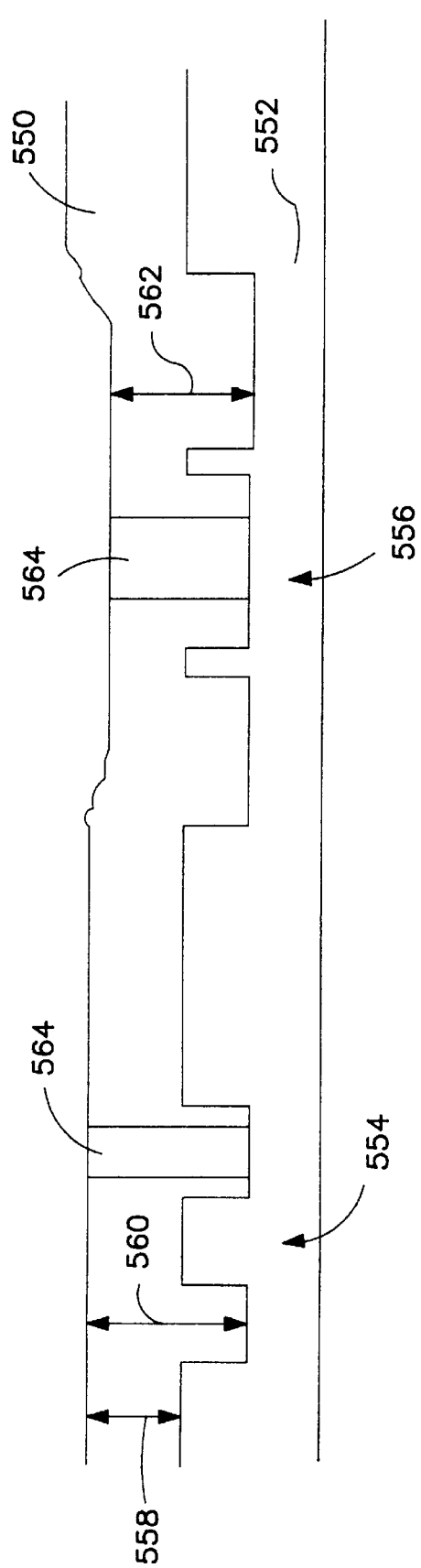
FIG. 15 is a cross-sectional schematic view of a step in the process of producing a dual damascene structure according to the prior art.

As is shown in FIG. 4, at step 100 (shown in FIG. 11), a photoresist film 215 is formed on the oxide film 210. As is shown in FIG. 12, at step 115 (shown in FIG. 11), the photoresist film 215 is pattern-exposed using a via-pattern mask 230. At step 120 (shown in FIG. 11), the substrate is treated with an alkaline aqueous solution and the regions 235 that were exposed using the via-pattern 230 are developed. As is shown in FIG. 13, the photoresist film 215 is exposed a second time using a line-pattern mask 220 to form exposed regions 225 in the photoresist film 215. At step 110 (shown in FIG. 1), the exposed resist is baked and treated with agents such as HMDS or HMCTS (hexamethylcyclot.risilazane) to silylate the exposed regions.

At this stage in the process there is a dual-pattern including lines and vias formed in the photoresist film 215. The line-pattern is defined by the silylated regions 225 and the via-pattern is defined by regions 235 where the photoresist was removed during development. The dual-pattern of FIG. 13 is the same as the pattern shown in FIG. 6. Steps 125 through 140 are performed to form the dual damascene structure in the oxide film 210 as described above.

What is claimed:

1. A process of forming a dual damascene pattern in a photoresist film formed on a semiconductor substrate comprising the steps of:
   (a) pattern exposing the photoresist film to form a first pattern in the photoresist film;
   (b) forming a resistant layer in the first pattern that is resistant to a further pattern exposure and etching; and
   (c) pattern exposing and developing the photoresist film to form a second pattern in the photoresist film; followed by:
   (d) etching the substrate in a first etching step to form the second pattern in the substrate; and then
   (e) etching the substrate in a second etching step to form the first pattern in the substrate.

2. The process according to claim 1 wherein the first pattern is different from the second pattern.

3. The process according to claim 1 wherein developing the resist film in step (c) comprises removing sections of the phototresist film corresponding to the second pattern.

4. The process according to claim 1 wherein step (e) further comprises the step of removing the resistant layer.

5. The process according to claim 1 wherein step (b) comprises the steps of:
   (b1) exposing sections of the photoresist film; and
   (b2) silylating the exposed sections of the photoresist film.

6. The process according to claim 5 wherein step (b2) further comprises the steps of:
   (1) baking the photoresist film; and
   (2) exposing the photoresist film to a compound selected from the group consisting of hexa-methyl-cyclo tri-silazane and hexa-methyl di-silazane.

7. The process according to claim 1 wherein the first pattern is a line-pattern and the second pattern is a via-pattern.

8. The process according to claim 1 wherein the steps are performed in the sequence of step (a), step (b), step (c), step (d), and step (e).

9. The process according to claim 1 wherein the steps are performed in the sequence of step (c), step (a), step (b), step (d), and step (e).

10. The process according to claim 1 wherein the first pattern forms one or more first features to be created on the substrate, the second pattern forms one or more second features to be created on the substrate, and wherein at least one of the first features is bounded within one of the second features.

11. The process according to claim 1 wherein step (a) further comprises directing radiation from one side of the substrate, and step (c) further comprises directing radiation from the same side of the substrate as in step (a).

12. The process according to claim 1 wherein etching steps (d) and (e) are carried out by reactive ion etching.

13. A process of etching a semiconductor substrate comprising the steps of:
   (a) forming a photoresist film on the substrate;
   (b) pattern exposing the resist film to form a first pattern in the photoresist film;
   (c) forming a resistant layer in the first pattern that is resistant to a further pattern exposure and etching; and
   (d) pattern exposing the photoresist film to form a second pattern in the photoresist film;
followed by
   (e) etching the substrate in a first etching step to form the first pattern in the substrate; and then
   (f etching the substrate in a second etching step to form the second pattern in the substrate.

14. A process of etching a semiconductor substrate comprising the steps of:
   (a) forming a photoresist film on the substrate;
   (b) pattern exposing the photoresist film to form a first pattern in the photoresist film;
   (c) forming a resistant layer in the first pattern that is resistant to a further pattern exposure and etching;
   (d) pattern exposing the photoresist film to form a second pattern in the resist film;
   (e) removing sections of the photoresist film corresponding to the second pattern;
   (f) etching the substrate in a first etching step to form the second pattern in the substrate;
   (g) removing the resistant layer;
   (h) etching the substrate in a second etching step to form the first pattern in the substrate; and
   (i) removing the photoresist film.

15. A process of making a semiconductor device comprising the steps of:
   (a) providing a semiconductor substrate including semiconductor components;
   (b) forming a layer on the substrate;
   (c) forming a photoresist film on the layer;
   (d) pattern exposing the resist film to form a first pattern in the photoresist film;
   (e) forming a resistant layer in the first pattern that is resistant to a further pattern exposure and etching; and
   (f) pattern exposing the photoresist film to form a second pattern in the photoresist film;
followed by
   (g) etching the layer in a first etching step to form the first pattern in the layer; and then
   (h) etching the layer in a second etching step to form the second pattern in the layer.

16. The process of claim 15 further comprising the step of forming a metal layer in the first pattern and the second pattern.

* * * * *